(12) United States Patent
Strasser et al.

(10) Patent No.: US 8,994,113 B2
(45) Date of Patent: Mar. 31, 2015

(54) SEMICONDUCTOR DEVICE AND METHOD OF MANUFACTURING A SEMICONDUCTOR DEVICE

(71) Applicant: Infineon Technologies Dresden GmbH, Dresden (DE)

(72) Inventors: Marc Strasser, Unterhaching (DE); Karl-Heinz Gebhardt, Dresden (DE); Andreas Meiser, Sauerlach (DE); Till Schloesser, Munich (DE)

(73) Assignee: Infineon Technologies Dresden GmbH, Dresden (DE)

( * ) Notice: Subject to any disclaimer, the term of this patent is extended or adjusted under 35 U.S.C. 154(b) by 0 days.

(21) Appl. No.: 13/864,339

(22) Filed: Apr. 17, 2013

(65) Prior Publication Data

US 2014/0312417 A1    Oct. 23, 2014

(51) Int. Cl.
| | |
|---|---|
| *H01L 21/336* | (2006.01) |
| *H01L 29/06* | (2006.01) |
| *H01L 29/66* | (2006.01) |
| *H01L 29/78* | (2006.01) |
| *H01L 29/10* | (2006.01) |

(52) U.S. Cl.
CPC ......... *H01L 29/0653* (2013.01); *H01L 29/1083* (2013.01); *H01L 29/1095* (2013.01); *H01L 29/66681* (2013.01); *H01L 29/7823* (2013.01)
USPC ............. 257/368; 257/E29.066; 257/E29.256

(58) Field of Classification Search
CPC ............ H01L 29/1083; H01L 29/1095; H01L 29/42368; H01L 29/7801
USPC .......................... 257/E29.066, E29.256, 368
See application file for complete search history.

(56) References Cited

U.S. PATENT DOCUMENTS

| | | | | |
|---|---|---|---|---|
| 8,304,303 | B2 * | 11/2012 | Pendharkar | 438/195 |
| 2003/0173624 | A1 * | 9/2003 | Choi et al. | 257/368 |
| 2012/0009740 | A1 * | 1/2012 | Cheng et al. | 438/135 |
| 2013/0087828 | A1 * | 4/2013 | Koshimizu et al. | 257/139 |
| 2014/0024186 | A1 * | 1/2014 | Yoo et al. | 438/275 |

* cited by examiner

*Primary Examiner* — John C Ingham
(74) *Attorney, Agent, or Firm* — Murphy, Bilak & Homiller, PLLC (57) ABSTRACT

A semiconductor device formed in a semiconductor substrate includes an isolation trench in the semiconductor substrate to laterally insulate adjacent components of the semiconductor device. A lateral isolation layer is disposed in the isolation trench. The semiconductor device further includes a source region and a drain region, and a body region and a drift region disposed between the source region and the drain region. The semiconductor device additionally includes a gate electrode adjacent to at least a portion of the body region and a field plate adjacent to at least a portion of the drift region. A field dielectric layer is disposed between the drift region and the field plate. A top surface of the field dielectric layer is disposed at a greater height measured from a first main surface of the semiconductor substrate than a top surface of the lateral isolation layer.

20 Claims, 10 Drawing Sheets

SEMICONDUCTOR DEVICE AND METHOD OF MANUFACTURING A SEMICONDUCTOR DEVICE

BACKGROUND

MOS (metal oxide semiconductor) power transistors or MOS power devices which are commonly employed in automotive and industrial electronics, should have a low on-state resistance ($R_{on}$) when being switched on. In an off-state, they should have a high breakdown voltage characteristic and withstand high source-drain voltages. For example, a MOS power transistor should withstand a drain-source voltage $V_{ds}$ of some tens to some hundreds or even thousand volts when being switched off. As a further example, MOS power transistors conduct a very large current which may be up to some hundreds of amperes when a gate-source voltage of about 2 to 20 V is applied, and at a low voltage drop $V_{ds}$.

In a lateral power device a current flow mainly is effected in a direction parallel to a first main surface of a semiconductor substrate. Generally, in power devices a predetermined thickness of the isolation layer that is disposed between the field plate and the silicon drift region improves the on-current at a certain breakdown voltage characteristic.

Attempts are being made in order to improve the isolation layer between the field plate and the drift region.

SUMMARY

According to an embodiment, a semiconductor device formed in a semiconductor substrate comprises an isolation trench in the semiconductor substrate to laterally insulate adjacent components of the semiconductor device, a lateral isolation layer being disposed in the isolation trench, a source region and a drain region, and further a body region and a drift region disposed between the source region and the drain region. The semiconductor device further comprises a gate electrode adjacent to at least a portion of the body region and a field plate adjacent to at least a portion of the drift region, a field dielectric layer being disposed between the drift region and the field plate, and a top surface of the field dielectric layer being disposed at a greater height measured from a first main surface of the semiconductor substrate than a top surface of the lateral isolation layer.

According to a further embodiment, a semiconductor device comprises a source region and a drain region, a body region and a drift region disposed between the source region and the drain region. The semiconductor device further comprises a gate electrode adjacent to at least a portion of the body region, and a conductive layer in a layer over the gate electrode, the conductive layer being connected with one of the source region and the gate electrode, a field dielectric layer being disposed between the drift region and a portion of the conductive layer, the field dielectric layer being in contact with the drift region and the portion of the conductive layer.

According to an embodiment, a method of manufacturing a semiconductor device in a semiconductor substrate, comprises forming an isolation trench in the semiconductor substrate and forming a lateral isolation layer in the isolation trench to laterally insulate adjacent components of the semiconductor device, forming a source region and a drain region, forming a body region and a drift region so as to be disposed between the source region and the drain region, forming a gate electrode adjacent to at least a portion of the body region, forming a field plate adjacent to at least a portion of the drift region, forming a field dielectric layer so as to be disposed between the drift region and the field plate, wherein the field dielectric layer is formed so that a top surface of the field dielectric layer is disposed at a greater height measured from a first main surface of the semiconductor substrate than a top surface of the lateral isolation layer.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention include such modifications and variations. The examples are described using specific language which should not be construed as limiting the scope of the appending claims. The drawings are not scaled and are for illustrative purposes only. For clarity, the same elements have been designated by the same references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The Figures and the description illustrate relative doping concentrations by indicating "−" or "+" next to the doping type "n" or "p". For example, "n⁻" means a doping concentration which is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to embodiments of the present application, generally, silicon carbide (SiC) or gallium nitride (GaN) is a further example of the semiconductor substrate material.

The term "vertical" as used in this specification intends to describe an orientation which is arranged perpendicular to the first surface of the semiconductor substrate or semiconductor body.

The terms "lateral" and "horizontal" as used in this specification intends to describe an orientation parallel to a first surface of a semiconductor substrate or semiconductor body. This can be for instance the surface of a wafer or a die.

Generally, for patterning material layers, a photolithographic method may be used in which a suitable photoresist material is provided. The photoresist material is photolithographically patterned using a suitable photomask. The patterned photoresist layer can be used as a mask during subsequent processing steps. For example, as is common, a hardmask layer or a layer made of a suitable material such as silicon nitride, polysilicon or carbon may be provided over the material layer to be patterned. The hardmask layer is photolithographically patterned using an etching process, for example. Taking the patterned hardmask layer as an etching mask, the material layer is patterned.

Figure 1:
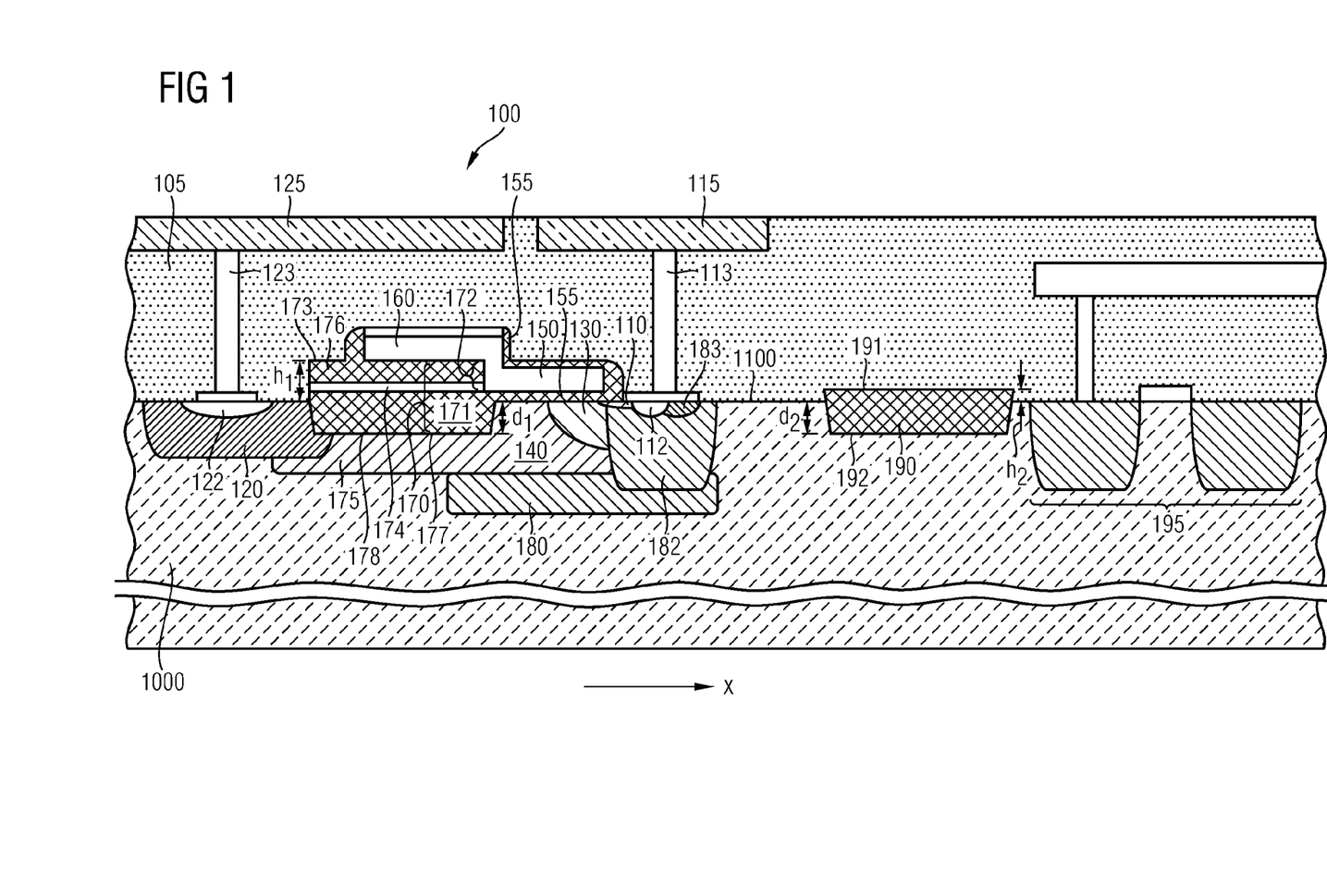
FIG. 1 shows a cross-sectional view of a semiconductor device according to an embodiment.

FIG. 1 illustrates a semiconductor device 100 according to an embodiment. The semiconductor device 100 is formed in a semiconductor substrate 1000 having a first main surface 1100. The semiconductor device 100 comprises a source region 110, and a drain region 120, a body region 130 and a drift region 140 that are formed adjacent to the first main surface 1100 of the semiconductor substrate 1000. For example, the source and drain regions 110, 120 may be doped with dopants of a first conductivity type, and the body region 130 may be doped with dopants of a second conductivity type that is different from the first conductivity type. The drift region may be doped with dopants of the first conductivity type. For example, the first conductivity type may be n-type and the second conductivity type may be p-type. As is clearly to be understood, the doping types may be reversed. A gate electrode 150 is disposed adjacent to the first main surface 1100 of the semiconductor substrate 1000. The gate electrode 150 may be insulated from the adjacent semiconductor material by means of a gate dielectric layer 155.

Moreover, the semiconductor device comprises a field plate 160 that is insulated from the drift zone 140 by means of a field dielectric layer 170. A thickness of the field dielectric layer 170 is larger than a thickness of the gate dielectric layer 155. As is illustrated in FIG. 1, the gate electrode 150 is disposed adjacent to a part of the drift region 140. According to the embodiment shown in FIG. 1, the gate electrode 150 and the field plate 160 are integrally formed from one conductive layer. For example, the gate electrode 150 and the field plate 160 may be made from one conductive layer or from a portion of a conductive layer. Further, the gate electrode 150 and the field plate 160 may be connected. Due to the increase of thickness from the gate dielectric layer 155 to the field dielectric layer or within the field dielectric layer, there is a step in the one conductive layer from the gate electrode 150 to the field plate 160.

The source region 110 is connected via a source contact region 112 and a source contact plug 113 to a source conductive layer 115. Further, the drain region 120 is coupled via a drain contact region 122 and a drain contact plug 123 to a drain conductive layer 125. The source conductive layer 115 may be connected with a source terminal, and the drain conductive layer 125 may be connected with a drain terminal. According to an embodiment, the source and/or drain conductive layer may be implemented by a metallization layer. According to another embodiment, these layers may be implemented by doped polysilicon layers. As is to be clearly understood, the source and/or drain conductive layer may be implemented by any other conductive material. An appropriate voltage may be applied between the source terminal and the drain terminal. A compensation layer 180 which may be of the second conductivity type may be disposed beneath the drift region 140. For example, the compensation layer 180 is connected via the compensation layer connection 182 and the compensation layer contact 183 with the source terminal.

According to the embodiment of FIG. 1, the source region 110, the body region 130, the drift region 140 and the drain region 120 are disposed in this order along a first direction or x direction that is parallel to the first main surface 1100 of the semiconductor substrate 1000. Hence, this semiconductor device implements a lateral power device in which a current flow is approximately parallel to the first main surface 1100 of the semiconductor substrate 1000. In particular, in such a lateral power device, the gate electrode controls the current flow in a direction parallel to the first main surface 1100 of the semiconductor substrate 1000.

When the semiconductor device 100 is switched on, by applying a corresponding gate voltage to the gate electrode 150, a conductive inversion channel is formed at the boundary between the body region 130 and the gate dielectric 155. Accordingly, the transistor is in a conducting state from the source region 110 to the drain region 120 via the channel in the body region 130 and the drift region 140. In case of switching-off, due to the presence of the compensation layer 180 carrier compensation takes place in a similar manner as in a superjunction device. Further, in an off-state, charge carriers are removed due to the presence of the field plate. The charge compensation in addition to the function of the field plate allows for an improved trade-off between a high breakdown voltage and a low on-resistance $R_{on}$.

The semiconductor device 100 may comprise further components 195, which are separated from the power transistor by means of an isolation trench 190. The isolation trench 190 may be filled with a lateral isolation layer. According to an embodiment, the isolation trench may be a so-called shallow trench isolation (STI) isolation trench. The STI isolation trenches 190 may laterally separate and insulate components of the devices from each other. For example, logic circuitry may be implemented in the same semiconductor substrate and may be insulated from the power device by the shallow trench isolation trenches 190. The isolation trenches 190 may have a depth of approximately 150 to 500 nm or more, for example, 150 to 300 nm.

According to an embodiment, a field dielectric trench 178 may be formed in the semiconductor substrate 1000. The field dielectric trench 178 extends from the first main surface 1100 in the drift region 140. The field dielectric layer 170 may be disposed in the field dielectric trench.

According to the embodiment illustrated in FIG. 1, a top surface 173 of the field dielectric layer 170 disposed between the drift region 140 and the field plate 160 is disposed at a greater height $h_1$ measured from the first main surface 1100 of the semiconductor substrate 1000 than a height $h_2$ from a top surface 191 of the shallow trench isolation layer disposed in the isolation trench 190. As a consequence, the breakdown voltage of the transistor can be set independently from a layer thickness of the shallow trench isolation layer disposed in the isolation trench 190.

In the embodiment of FIG. 1, the field dielectric layer 170 comprises a first region 171 in which the top surface of the field dielectric layer is disposed at approximately the same height as the top surface 191 of the shallow trench isolation layer formed in the isolation trench 190. The field dielectric layer further comprises a second region 172, in which the top surface 173 of the field dielectric layer is disposed at a greater height measured from the first main surface 1100 of the semiconductor substrate 1000 than the top surface 191 of the shallow trench isolation layer disposed in the isolation trench 190. For example, the second region 172 may be smaller than the first region 171. As is specifically shown in FIG. 1, the second region 172 is disposed on the side of the drift region that is adjacent to the drain region 120, and the first region 171 is disposed on a side of the drift region remote from the drain region 120. The first region 171 and the second region 172 may be disposed in the field dielectric trench 178. Due to this specific arrangement, the breakdown voltage can be further increased or improved.

According to an embodiment, the field dielectric layer 170 may comprise the material 175 of the shallow trench isolation layer and a material 174 different from the material of the shallow trench isolation layer. The material 175 of the shallow trench isolation layer may be disposed in a lower portion of the field dielectric trench 178, and the material 174 may be disposed in an upper portion of the field dielectric trench 178.

According to an embodiment, an interlayer dielectric material 105 may be disposed between the substrate surface 1100 and the source and drain conductive layers 115, 125. According to an embodiment, the interlayer dielectric may comprise a so-called low-k material having a low value of k (permittivity or relative dielectric constant).

According to the embodiment of FIG. 1, a bottom side 192 of the isolation trench 190 is disposed at approximately the same depth $d_2$ measured from the first main surface 1100 of the semiconductor substrate 1000 as the depth $d_1$ of the bottom side 177 of the field dielectric trench 178. Nevertheless, according to a further embodiment, the bottom side 192 of the isolation trench 190 may be disposed at a smaller depth $d_2$ than the depth $d_1$ of the bottom side 177 of the field dielectric trench 178.

According to the embodiment shown in FIG. 1, it is possible to manufacture the field dielectric trench 178 and the isolation trench 190 for the shallow trench isolation using common or joint processing methods. For example, the field dielectric trench 178 and the isolation trench 190 may be formed by joint etching steps. Moreover, the field dielectric layer 170 and the shallow trench isolation layer may be formed by joint processes. Further, the field dielectric layer 170 may be formed so that a top surface 173 of the field dielectric layer 170 is disposed at a greater height $h_1$ measured from the first main surface 1100 of the semiconductor substrate 1000 than a height $h_2$ of the top surface 191 of the shallow trench isolation layer formed in the isolation trench 190. Accordingly, the thickness of the field dielectric layer 170 may be set so that the electrical characteristics of the device may be set according to the specific demands. In particular, the breakdown voltage as well as the switching resistance of the semiconductor device may be set. Further, by specifically setting the dimensions, in particular along the first or x direction, of the second region 172 of the field dielectric layer, these properties can be further set.

Figure 2:
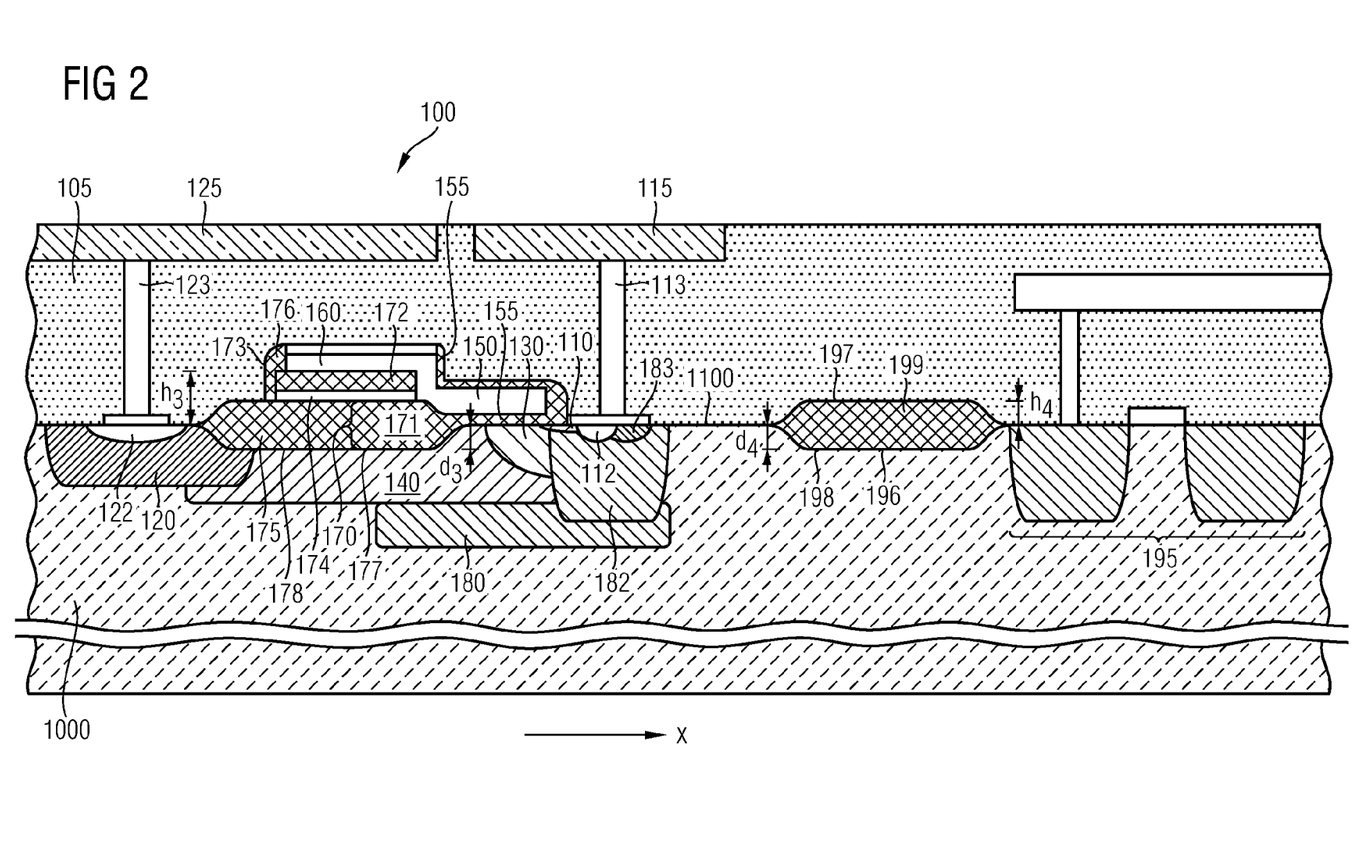
FIG. 2 illustrates a cross-sectional view of a semiconductor device according to another embodiment.

FIG. 2 shows a cross-sectional view of a semiconductor device according to another embodiment. FIG. 2 illustrates approximately the same components as FIG. 1. According to the embodiment of FIG. 2, an isolation trench 196 is disposed between adjacent components of the semiconductor device 100. A lateral isolation layer 199 is disposed in the isolation trench 196. The isolation trench including the lateral isolation layer 199 is manufactured by means of a so-called LOCOS process (local oxidation of silicon). According to this process, portions of a silicon surface are masked by a masking material. Subsequently, the silicon surface is exposed to an oxidizing atmosphere such as an oxygen-rich atmosphere at elevated temperatures. As a consequence, a silicon oxide layer is caused to grow on the uncovered portions of the silicon surface. Since this process consumes silicon, an isolation trench 196 is formed in the silicon surface 1100.

In the embodiment of FIG. 2, the field dielectric layer 170 comprises a first region 171 in which the top surface of the field dielectric layer is disposed at approximately the same height as the top surface 197 of the lateral isolation layer formed in the isolation trench 196. The field dielectric layer further comprises a second region 172, in which the top surface 173 of the field dielectric layer is disposed at a greater height measured from the first main surface 1100 of the semiconductor substrate 1000 than the top surface 197 of the lateral isolation layer disposed in the isolation trench 196. For example, the second region 172 may be smaller than the first region 171. According to an embodiment, the second region 172 may be disposed on the side of the drift region that is adjacent to the drain region 120, and the first region 171 may be disposed on a side of the drift region remote from the drain region 120. The first region 171 and the second region 172 may be disposed in a field dielectric trench 178. Due to this specific arrangement, the breakdown voltage can be further improved.

According to an embodiment, the field dielectric layer 170 may comprise the material 175 of the lateral isolation layer 199 and a material 174 different from the material of the lateral isolation layer. The material 175 of the lateral isolation layer may be disposed in a lower portion of the field dielectric trench 178, and the material 174 may be disposed in an upper portion of the field dielectric trench 178.

According to the embodiment of FIG. 2, a bottom side 198 of the isolation trench 196 is disposed at approximately the same depth $d_4$ measured from the first main surface 1100 of the semiconductor substrate 1000 as the depth $d_3$ of the bottom side 177 of the field dielectric trench 178. Nevertheless, according to a further embodiment, the bottom side 198 of the isolation trench 196 may be disposed at a smaller depth $d_4$ than the depth $d_3$ of the bottom side 177 of the field dielectric trench 178.

According to the embodiment shown in FIG. 2, it is possible to manufacture the field dielectric trench 178 and the isolation trench 196 for the lateral isolation using common or joint processing methods. For example, for forming the field dielectric trench 178 and the isolation trench 196 a masking material may be formed over the substrate surface 1100 and correspondingly patterned. Thereafter, an oxidation process may be performed in an oxidizing atmosphere at elevated temperatures. Thereby, the field dielectric layer 170 and the lateral isolation layer 199 may be formed in the corresponding regions of the substrate surface 1100. Thereafter, the field dielectric layer 170 may be formed so that a top surface 173 of the field dielectric layer 170 is disposed at a greater height $h_3$ measured from the first main surface 1100 of the semiconductor substrate 1000 than a height $h_4$ of the top surface 197 of the lateral isolation layer formed in the isolation trench 196. Accordingly, the thickness of the field dielectric layer 170 may be set so that the electrical characteristics of the device are set according to the specific demands. In particular, the breakdown voltage as well as the switching resistance of the semiconductor device may be set. Further, by specifically setting the dimensions, in particular along the first or x direction, of the second region 172 of the field dielectric layer, these properties can be further set.

Figure 3A:
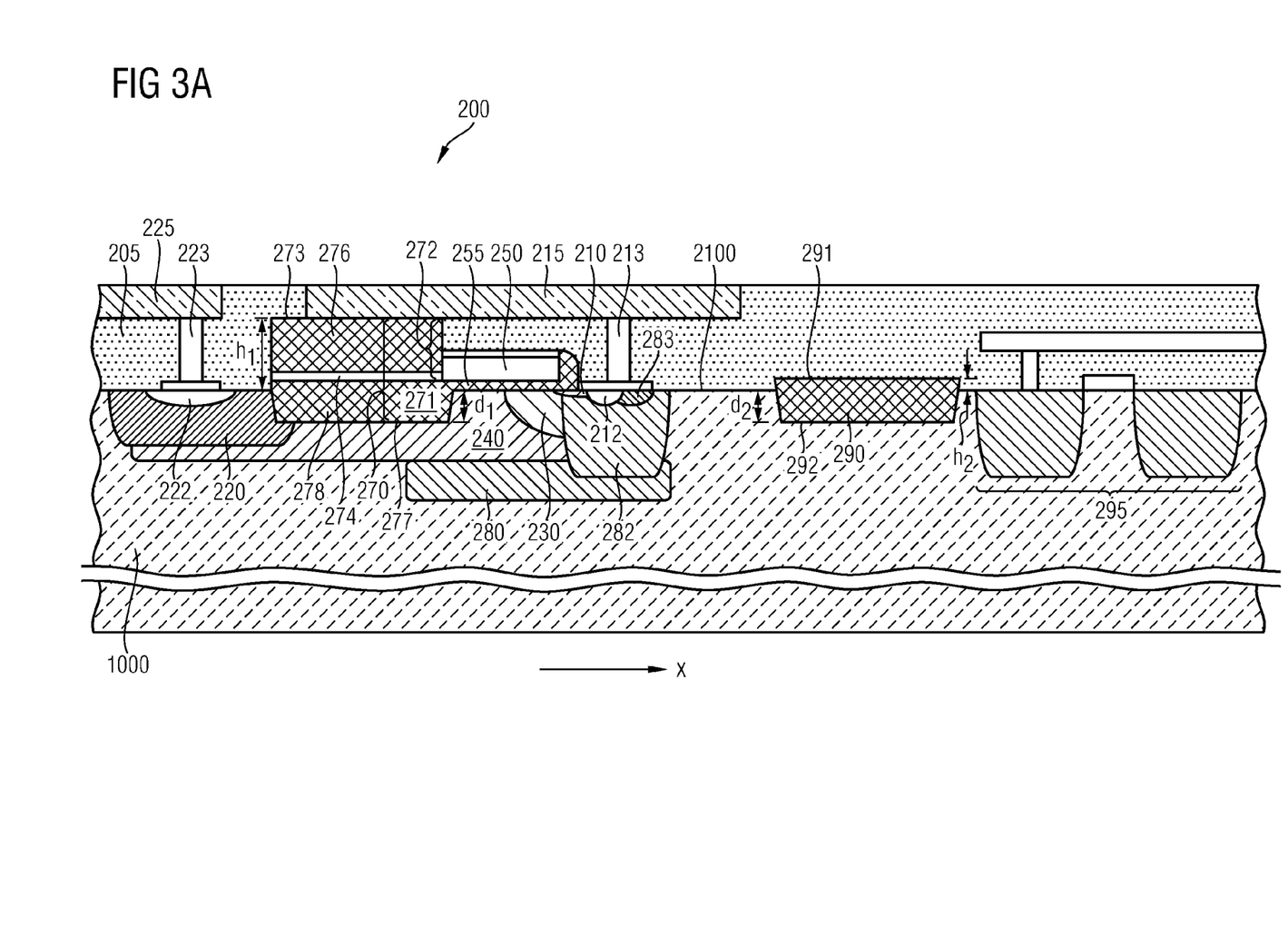
FIGS. 3A and 3B illustrate cross-sectional views of semiconductor devices according to further embodiments.
Figure 3B:
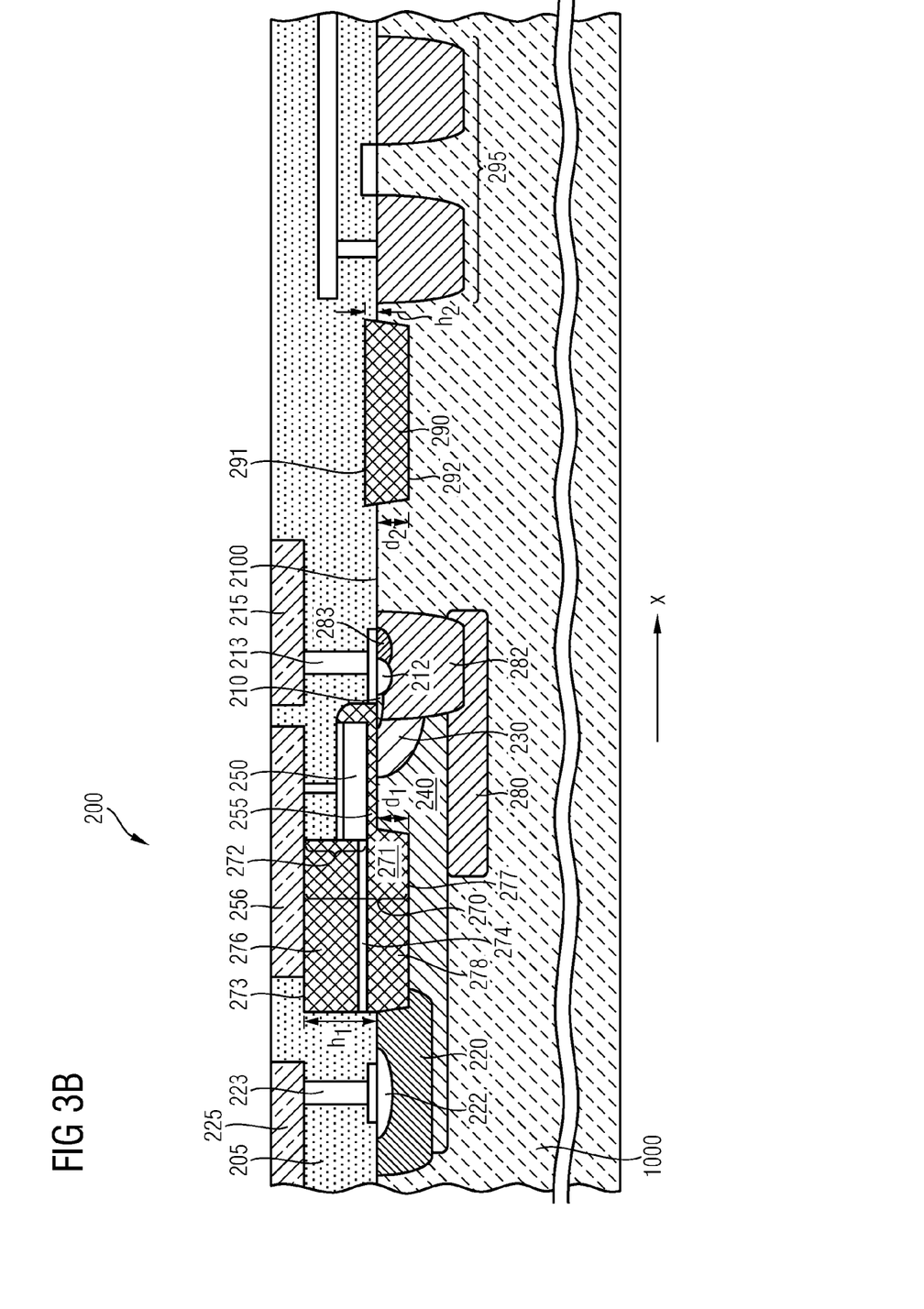

FIGS. 3A and 3B show cross-sectional views of a semiconductor device according to further embodiments. Unless indicated otherwise, the same components in FIGS. 3A and 3B are denoted by the same reference numerals, the reference numerals being incremented by 100 with respect to FIG. 1 or FIG. 2. The semiconductor device 200 of FIGS. 3A and 3B comprises a source region 210 and a drain region 220, for example, having the first conductivity type. The body region 230 and the drift region 240 are arranged between the source region 210 and the drain region 220. The compensation layer 280 is disposed beneath the drift region 240. The source region is connected via the source contact 212 and the source contact plug 213 with a source conductive layer 215. Further, the drain region 220 is connected via the drain contact region 222 and the drain contact plug 223 with a drain conductive layer 225. The drain conductive layer 225 may be connected with a drain terminal, the source conductive layer 215 may be connected with a source terminal. The compensation layer 280 may be connected via the compensation layer connection 282 and the compensation layer contact 283 with the source contact plug 213.

The semiconductor device further comprises a gate electrode 250. A gate dielectric 255 may be disposed between the gate electrode 250 and the body region 230. The source conductive layer 215 is disposed in a layer over the gate electrode. The gate electrode 250 is not connected with the source conductive layer 215. Further, a distance between the source conductive layer 215 and the first main surface 2100 of the semiconductor substrate 1000 is larger than a distance between the gate electrode 250 and the first main surface 2100 of the semiconductor substrate 1000. The field dielectric layer 270 is disposed between a portion of the drift region 240 and a portion of the source conductive layer 215. The field dielectric layer is in contact with the drift region 240 and the portion of the source conductive layer 215. According to the embodiment of FIG. 3A, a part of the source conductive layer 215 acts as a field plate.

As is shown in FIG. 3B, the semiconductor device 200 further comprises a gate conductive layer 256. For example, the gate conductive layer 256 may implement a gate runner as is generally employed. In FIG. 3B, the gate conductive layer 256 and the source conductive layer 215 are disposed at approximately the same height measured from a main surface 2100 of the semiconductor substrate 1000. As is to be clearly understood, the gate conductive layer 256 and the source conductive layer 215 may as well be disposed at different heights. According to the embodiment of FIG. 3B, a part of the gate conductive layer 256 acts as a field plate.

According to the embodiments of FIGS. 3A and 3B, the conductive layer 215, 256 is disposed in a layer over the gate electrode 250. For example, this may mean that an insulating material is disposed between the gate electrode 250 and the conductive layer 215, 256. According to an example, an insulating material may be disposed between the gate electrode 250 and the conductive layer 215, 256 along a direction perpendicularly with respect to the main surface 2100 of the semiconductor substrate 1000. The term "the conductive layer is disposed in a layer over the gate electrode" may further mean that the conductive layer and the gate electrode are manufactured by different processes, performed at different timings, for example. According to an example, the conductive layer may be implemented by a metallization layer which is different from the gate electrode.

According to the embodiments of FIGS. 3A and 3B, the gate electrode 250 is disposed adjacent to the body region 230 and further is adjacent to a part of the drift region 240. The semiconductor device of FIGS. 3A and 3B further comprises an isolation trench 290 for providing a lateral isolation. The lateral isolation laterally separates and insulates the semiconductor device implementing the power device from further components 295 of the semiconductor device 200. For example, logic circuitry may be implemented in the same semiconductor substrate and may be insulated from the power device by the lateral isolation trenches 190, 196, 290. For example, the lateral isolation trench 190, 290 may implement a shallow trench isolation in the manner as has been explained with reference to FIG. 1. The lateral isolation trench 190, 290 may be formed by etching, followed by forming a shallow trench isolation layer.

Alternatively, in the manner as has been explained with reference to FIG. 2, the lateral isolation trench 196, 290 may be formed by a LOCOS process according to which the lateral isolation trench 196, 290 is formed using an oxidation process. The lateral isolation layer is disposed in the isolation trench 290. A top surface 291 of the lateral isolation layer disposed in the isolation trench 290 is disposed at a smaller height measured from the first main surface 2100 of the semiconductor substrate than a height of the top surface 273 of the field dielectric layer 270. The field dielectric layer 270 may be disposed in a field dielectric trench 278 formed in the semiconductor substrate 1000.

Moreover, a bottom side 292 of the isolation trench 290 may be disposed at approximately the same depth $d_2$ as the depth $d_1$ of the bottom side 277 of the field dielectric trench 278. Nevertheless, according to a further embodiment, the bottom side 292 of the isolation trench 290 may be disposed at a smaller depth $d_2$ than the depth $d_1$ of the bottom side 277 of the field dielectric trench 278. The power transistor including the source and the drain regions 210, 220 implements the same functionality as has been discussed above with reference to FIGS. 1 and 2. Nevertheless, due to the increased thickness of the field dielectric layer 270, at a given breakdown characteristic, the on-current is further increased.

Moreover, according to an embodiment, the interlayer dielectric 205 may be implemented as a low-k dielectric having a smaller dielectric constant than silicon dioxide. By implementing the field dielectric layer 270 by a layer stack comprising, e.g. silicon oxide and silicon nitride, the breakdown voltage characteristics of the semiconductor device can be further improved.

In the following, processes of the method of manufacturing a semiconductor device will be explained in more detail.

According to embodiments, the field oxide layer and the shallow trench isolation layer are manufactured by joint processing steps. Further, the field dielectric trench and the isolation trenches may be formed by joint processing steps. For example, the field dielectric trench and the isolation trenches may be formed by joint etching processes. Alternatively, the field dielectric trench and the isolation trenches may be formed by joint oxidation processes. According to recent developments, the depth of the shallow trench isolation trenches is decreased so that the breakdown voltage characteristics of a corresponding power transistor will be degraded. Further, when etching the trenches in which the field oxide is to be formed, silicon spires may remain that are due to defects, for example micro particles that are present on the main surface of the semiconductor substrate. As will be explained in the following, by implementing the method of manufacturing a semiconductor device, an appropriate thickness of the field dielectric layer may be provided.

Figure 4A:
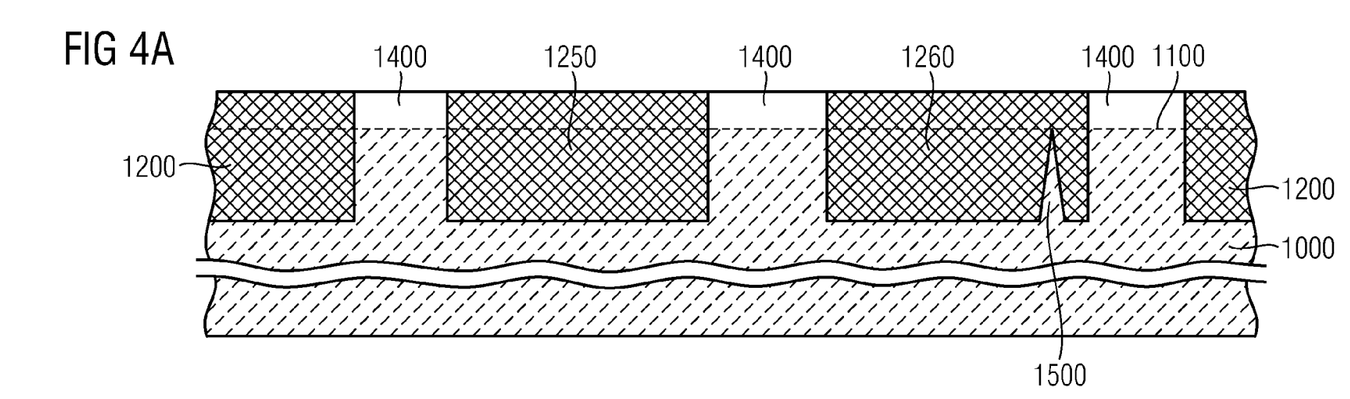
FIGS. 4A to 4D illustrate steps of a method of manufacturing a semiconductor device according to an embodiment.

FIGS. 4A to 4D illustrate a method of manufacturing a semiconductor device according to an embodiment. FIG. 4A shows an example of a starting point for forming the trenches filled with an insulating material. A plurality of trenches 1200, 1250, 1260 are formed in the main surface 1100 of a semiconductor substrate 1000. The trenches may have been formed by arbitrary processes comprising etching and LOCOS processes as has been explained above. The trenches 1200 may be isolation trenches which are commonly employed. Further, trench 1250 is a first field oxide trench, and trench 1260 is a second field oxide trench. The silicon spire 1500 which may be caused due to etching irregularities is disposed within second field oxide trench 1260. Remaining portions 1400 of a pad nitride layer (silicon nitride) are disposed between adjacent trenches. A portion on the insulating material in each of the trenches 1200, 1250, 1260 protrudes from the first main surface 1100 of the semiconductor substrate. The insulating material in the trenches may be silicon oxide which may be formed by deposition from TEOS (tetra ethyl ortho silicate), for example, by a PECVD (plasma enhanced chemically vapour deposition) method. Usually, a deglazing step for etching back the silicon oxide present in the trenches is performed.

Figure 4B:
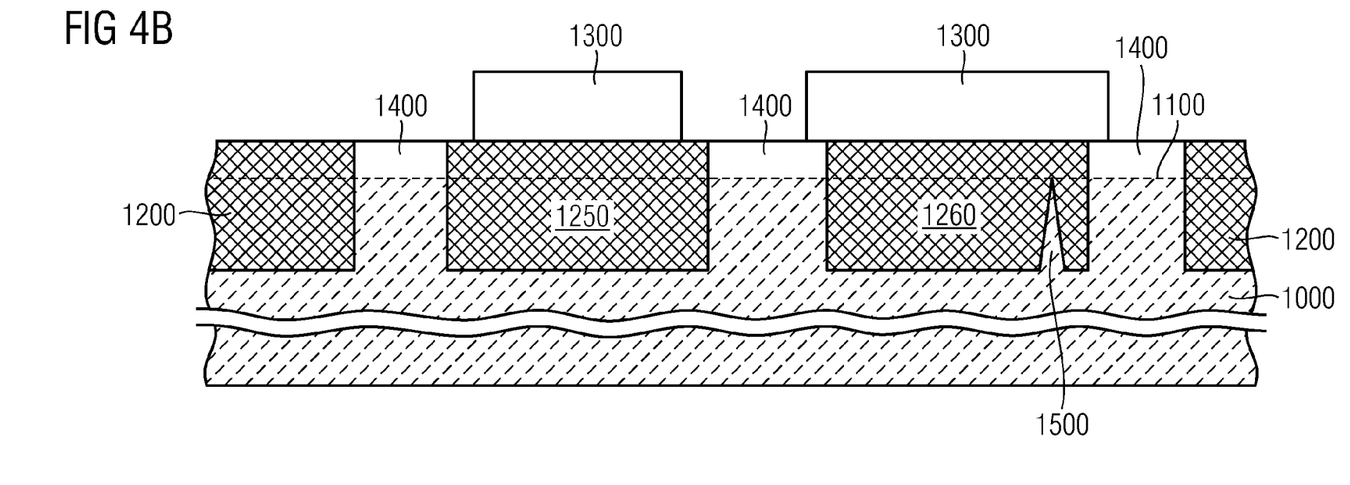

According to the embodiment illustrated in FIG. 4A, during this deglazing process, some of the trenches 1260 and portions of the trenches 1250 are covered by a photoresist layer or hard mask layer so as to mask the portions of these layers during the etching process. FIG. 4B shows a cross-sectional view of the substrate after forming a photoresist mask 1300. As is shown, the resist mask covers portions of the first field oxide trench 1250. Further, the resist mask completely covers the surface of the second field oxide trench 1260. Thereafter, a deglazing step is performed, for example, using wet etching with HF (fluoric acid).

Figure 4C:
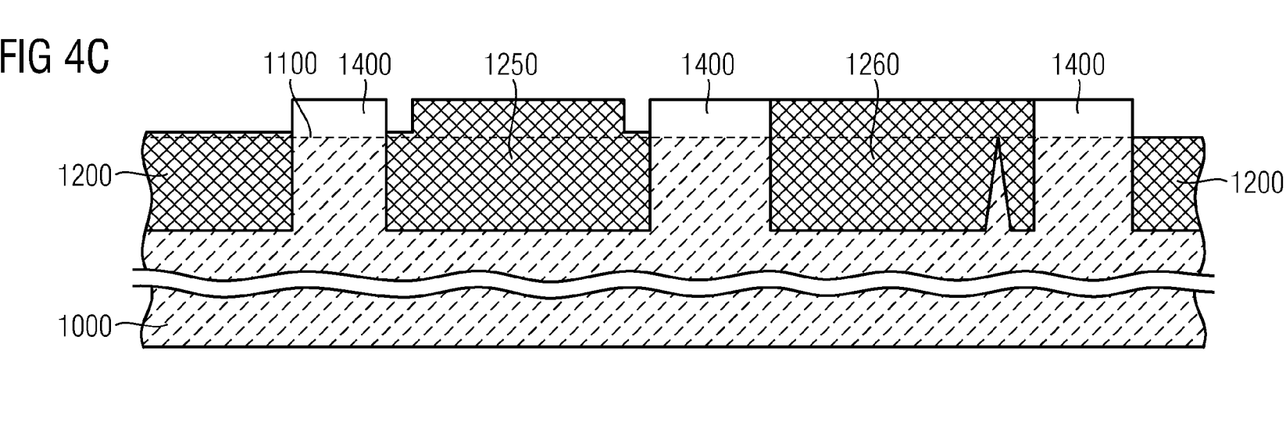

FIG. 4C shows a cross-sectional view of an example of a resulting structure. As is shown, the insulating material over the STI trenches 1200 is etched, whereas almost no insulating material is etched from the surface of the second field oxide trenches 1260. Moreover, a portion of the silicon oxide layer over the first field oxide trench 1250 is etched.

Figure 4D:
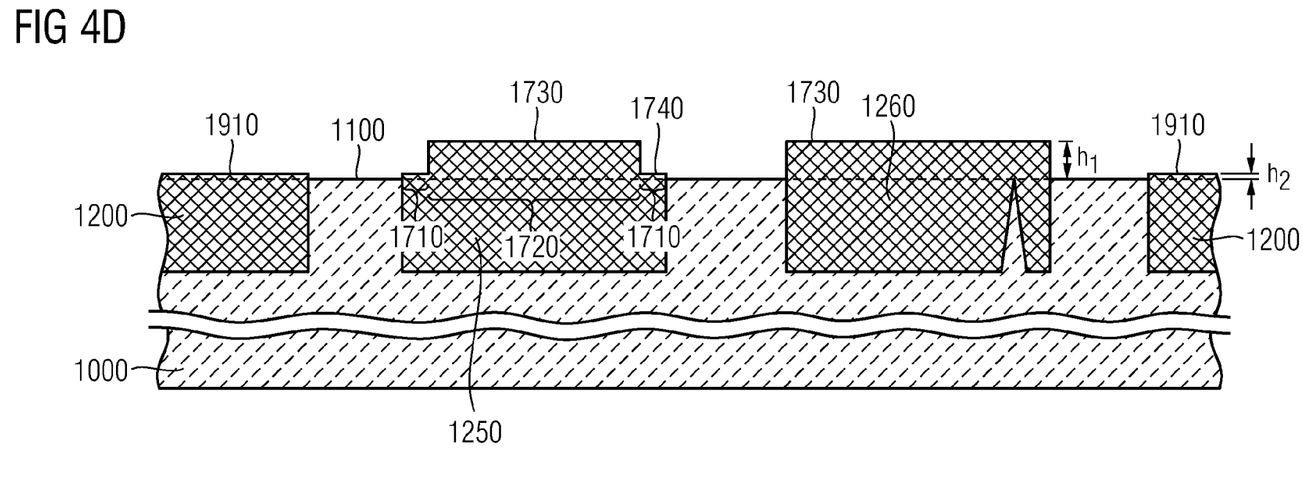

Thereafter, the remaining portions of the pad nitride layer 1400 are removed. FIG. 4D shows an example of the resulting structure. As is further specifically shown, the field dielectric layer present in the first field oxide trench 1250 comprises a first region 1710, in which the silicon oxide material has been etched back. Accordingly, the top surface 1740 in the first region 1710 is approximately at the same height as the height $h_2$ of the top surface 1910 of the silicon oxide layer in the isolation trenches 1200. Further, the top surface 1730 of the second region 1720 is disposed at a larger distance or height $h_1$ from the first main surface 1100 of the semiconductor substrate 1000 than the top surface 1740 of the first region 1710. The top surface 1730 of the insulating material over the second field oxide trench 1260 is disposed at the height $h_1$. Moreover, the height $h_1$ is larger than a height $h_2$ of the top surface 1910 of the dielectric material in the isolation trenches 1200. As has been discussed above with reference to FIGS. 1 to 3, by setting the dimensions of the first region 1710, the breakdown characteristics of the power device can be further set.

FIGS. 5A to 5D show a further method according to an embodiment. The starting point is a semiconductor substrate 1100 comprising isolation trenches 1200, 1250, 1260 which may have been formed in a similar manner as according to the embodiment of FIGS. 4A to 4D. For example, the isolation trenches 1200, 1250, and 1260 may have been formed by etching or by a LOCOS process. Further, the insulating material in the isolation trenches 1200, 1250, 1260 has been etched back so that the surface of the insulating material in all trenches is approximately at a small height above the first main surface 1100 of the semiconductor substrate 1000. The isolation trenches comprise isolation trenches 1200 for providing a lateral isolation and a first field oxide trench 1250 and a second field oxide trench 1260. For example, the trenches formed in the silicon substrate 1000 may have a depth of approximately 150 to 500 nm or more. Thereafter, a thin silicon nitride layer 1650 is formed, followed by a further silicon oxide layer. For example, the silicon nitride layer 1650 may have a thickness of about 5 to 15 nm. Further, the silicon oxide layer may have a thickness of about 20 to 250 nm. The silicon nitride layer 1650 and the silicon oxide layer 1660 may be formed by common processes. For example, PECVD using TEOS as a starting material may be employed.

Figure 5A:
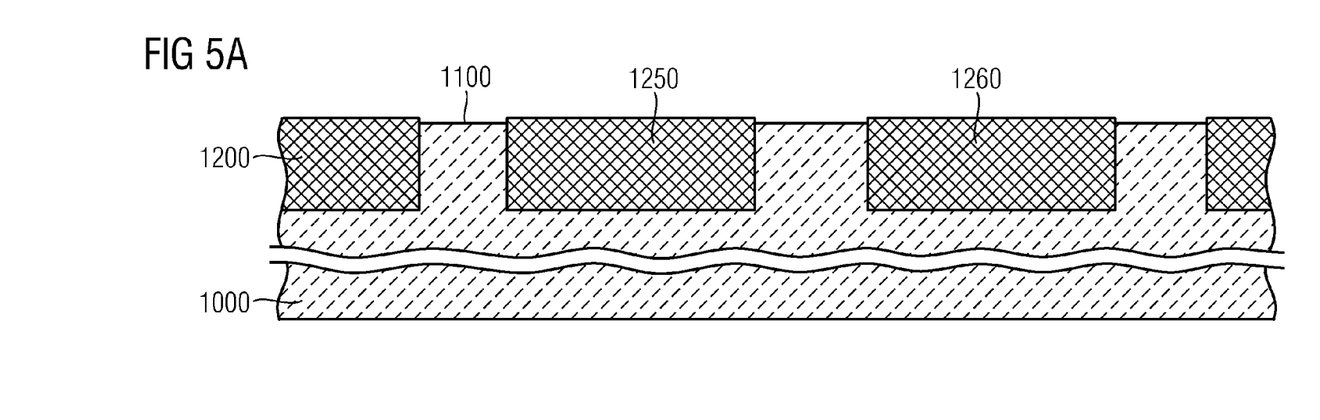
FIGS. 5A to 5D illustrate a method of manufacturing a semiconductor device according to a further embodiment.
Figure 5B:
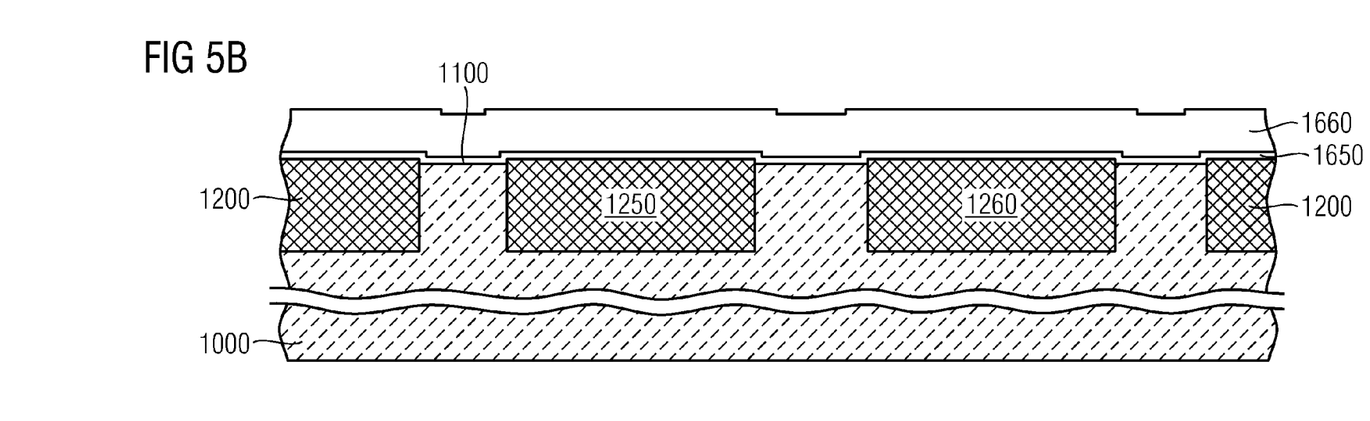
Figure 5C:
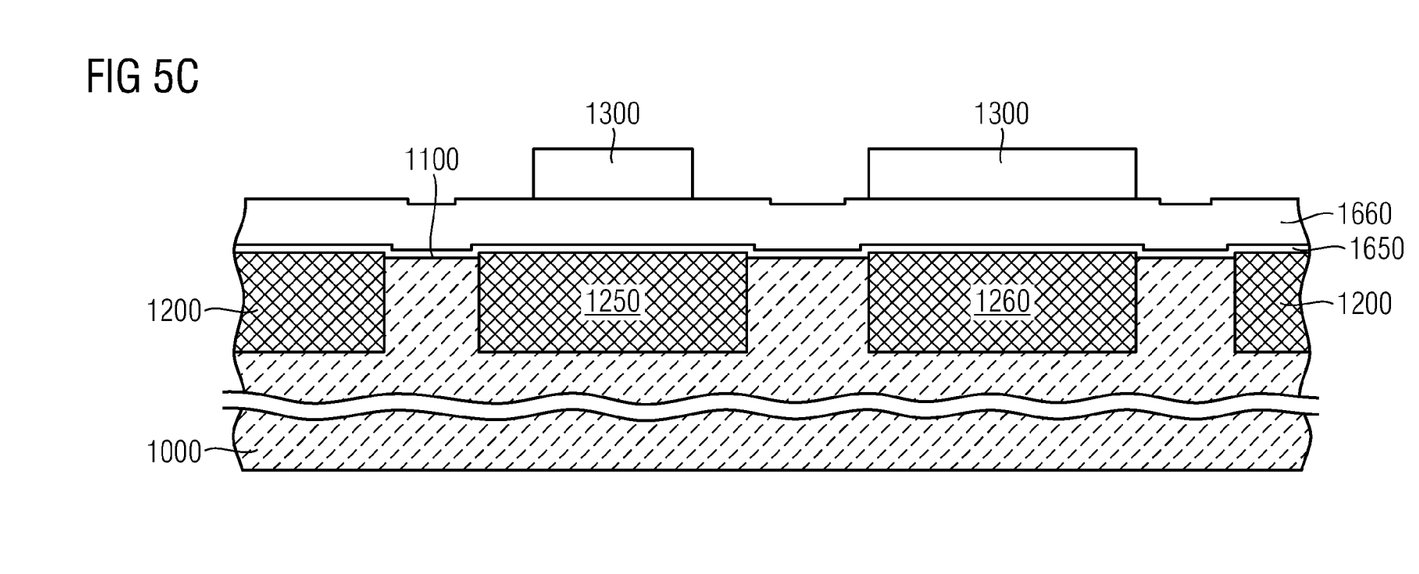

FIG. 5B shows an example of a resulting structure. Thereafter, a photoresist layer is formed over the resulting surface and is patterned so as to form a photoresist pattern 1300. FIG. 5C shows an example of a resulting structure. As is specifically shown, portions of the silicon oxide layer 1660 are covered by the photoresist material 1300. In particular, the photoresist layer over the first field oxide trench 1250 is disposed only over portions of the first field oxide trench 1250, whereas the photoresist layer 1300 is formed over the entire second field oxide trench 1260. Thereafter, an etching step is performed so as to etch the silicon oxide layer 1660 and the silicon nitride layer 1650. For example, silicon oxide may be etched selectively with respect to silicon nitride and vice versa so that the silicon nitride layer 1650 acts as an etching stop when etching the silicon oxide layer 1660.

Figure 5D:
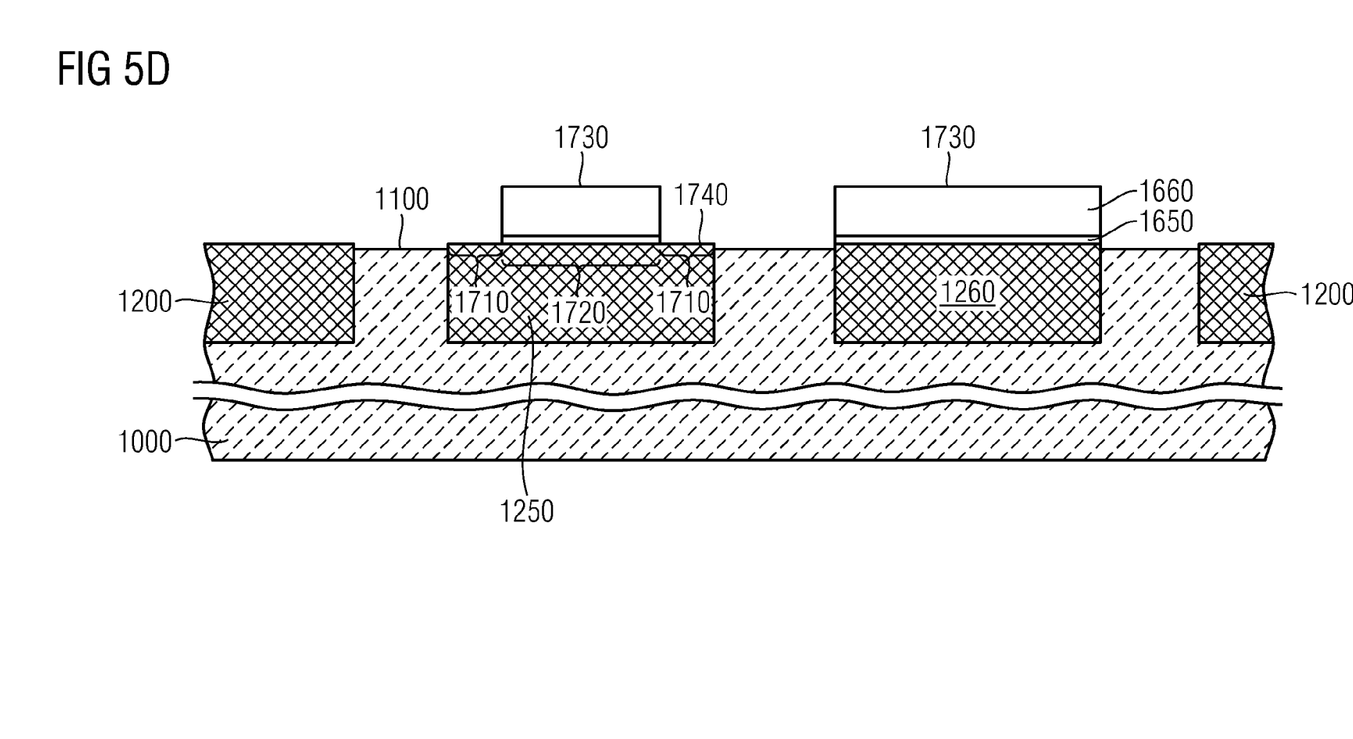

FIG. 5D shows an example of a resulting structure after performing a corresponding etching step. As is shown, the field oxide layer 1730 is formed over a portion of the first field oxide trench. Accordingly, the field oxide layer in the first field oxide trench 1250 comprises a first region 1710 and a second region 1720 in a similar manner as is shown in FIG. 4D. Further, the silicon oxide layer 1660 is disposed over the entire second field oxide trench 1260.

Figure 6:
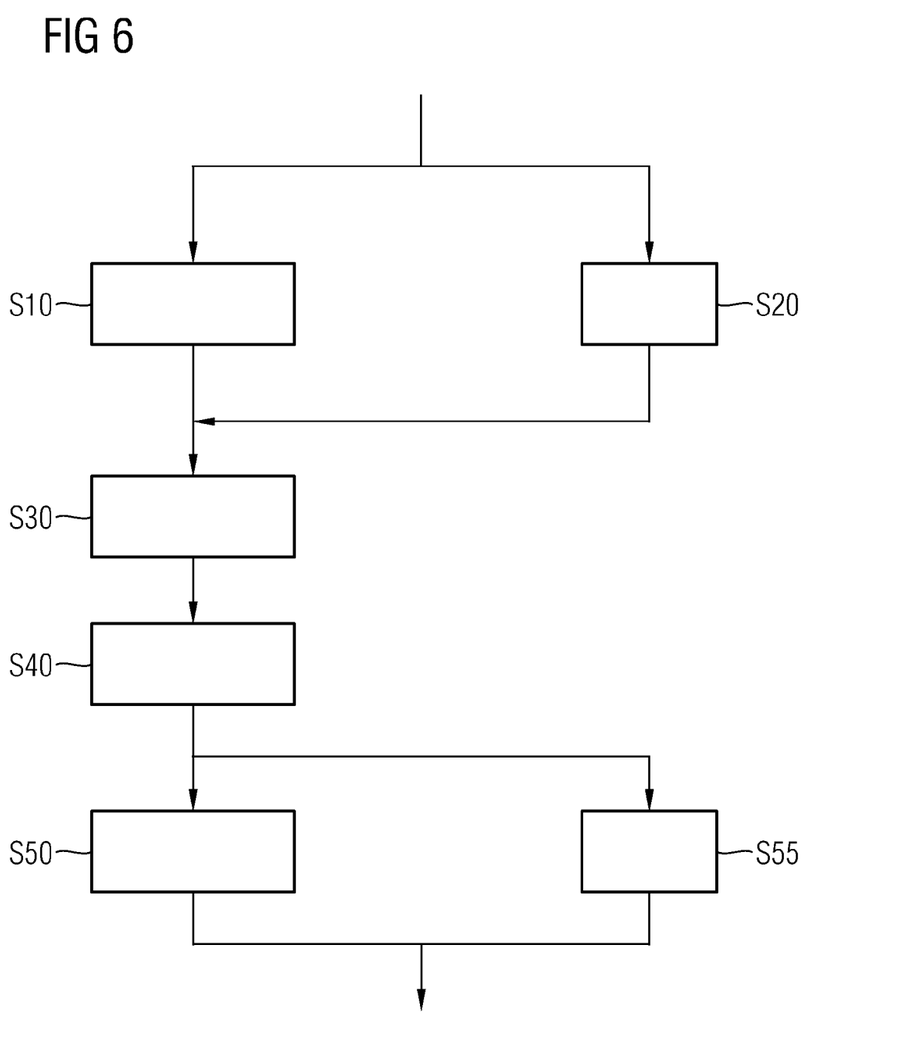
FIG. 6 schematically illustrates a method of manufacturing a semiconductor device according to an embodiment.

FIG. 6 summarizes some of the processes of a method for manufacturing a semiconductor device. As is shown, a method of manufacturing a semiconductor device in a semiconductor substrate, may comprise forming an isolation trench (S10) in the semiconductor substrate and forming a lateral isolation layer in the isolation trench to laterally insulate adjacent components of the semiconductor device, forming a source region and a drain region (S30), forming a body region and a drift region so as to be disposed between the source region and the drain region (S40), forming a gate electrode adjacent to at least a portion of the body region (S50), and forming a field plate adjacent to at least a portion of the drift region (S55).

The method further comprises forming a field dielectric layer (S20) so as to be disposed between the drift region and the field plate, wherein the field dielectric layer is formed so that a top surface of the field dielectric layer is disposed at a greater height measured from a first main surface of the semiconductor substrate than a top surface of the lateral isolation layer. According to an embodiment, forming the lateral isolation layer in the isolation trench and forming the field dielectric layer (S20) may be accomplished by joint processing methods. Further, forming the gate electrode (S50) and forming the field plate (S55) may be accomplished by joint processing methods.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device formed in a semiconductor substrate, comprising:
   an isolation trench in the semiconductor substrate to laterally insulate adjacent components of the semiconductor device, a lateral isolation layer being disposed in the isolation trench;
   a source region and a drain region;
   a body region and a drift region disposed between the source region and the drain region;
   a gate electrode adjacent to at least a portion of the body region; and
   a field plate adjacent to at least a portion of the drift region, a field dielectric layer being disposed between the drift region and the field plate, a top surface of the field dielectric layer being disposed at a greater height measured from a first main surface of the semiconductor substrate than a top surface of the lateral isolation layer,
   wherein the source region and the drain region are doped with dopants of a first conductivity type, the body region is doped with dopants of a second conductivity type, and the drift region is doped with dopants of the first conductivity type, the semiconductor device further comprising a compensation layer including a doped portion of the second conductivity type disposed adjacent to the drift region, the compensation layer being connected to a source terminal.

2. The semiconductor device according to claim 1, wherein the field plate and the gate electrode are integrally formed.

3. The semiconductor device according to claim 1, wherein the field dielectric layer is arranged in a field dielectric trench in the substrate.

4. The semiconductor device according to claim 1, wherein a lower part of the field dielectric layer comprises a material of the lateral isolation layer and an upper part of the field dielectric layer comprises an insulating material different from the material of the lateral isolation layer.

5. The semiconductor device according to claim 4, wherein the insulating material comprises silicon nitride.

6. The semiconductor device according to claim 1, wherein the isolation trench is configured to provide a shallow trench isolation.

7. The semiconductor device according to claim 1, wherein the isolation trench is a LOCOS ("local oxidation of silicon") trench.

8. The semiconductor device according to claim 1, wherein the field plate is implemented by a conductive layer, the conductive layer being disposed in a layer over the gate electrode and connected with one of the source region and the gate electrode.

9. The semiconductor device according to claim 1, wherein the source region, the drain region, the body region and the drift region are arranged along a first direction, the first direction being parallel to the first main surface of the semiconductor substrate, the source region, the drain region, the body region and the drift region forming a lateral transistor.

10. The semiconductor device according to claim 1, wherein the field dielectric layer comprises a first region, in which the top surface of the field dielectric layer is disposed at approximately the same height as the top surface of the lateral isolation layer, and a second region, in which the top surface of the field dielectric layer is disposed at a greater height measured from the first main surface of the semiconductor substrate than the top surface of the lateral isolation layer.

11. The semiconductor device according to claim 10, wherein the second region is disposed on a side of the drift region adjacent the drain region, and the first region is disposed on a side of the drift region remote from the drain region.

12. A method of manufacturing a semiconductor device in a semiconductor substrate, the method comprising:
    forming an isolation trench in the semiconductor substrate and forming a lateral isolation layer in the isolation trench to laterally insulate adjacent components of the semiconductor device;
    forming a source region and a drain region;
    forming a body region and a drift region between the source region and the drain region;
    forming a gate electrode adjacent to at least a portion of the body region;
    forming a field dielectric trench in the semiconductor substrate;
    forming a field plate adjacent to at least a portion of the drift region; and
    forming a field dielectric layer in the field dielectric trench between the drift region and the field plate,
    wherein the field dielectric layer is formed so that a top surface of the field dielectric layer is disposed at a greater height measured from a first main surface of the semiconductor substrate than a top surface of the lateral isolation layer,
    wherein a portion of the field dielectric layer in the field dielectric trench and the lateral isolation layer in the isolation trench are formed by joint processing.

13. The method according to claim 11, wherein the isolation trench is formed by an etching process.

14. The method according to claim 13, wherein the field dielectric trench and the isolation trench are formed by joint etching processes.

15. The method according to claim 11, wherein the isolation trench is formed by an oxidation process.

16. The method according to claim 15, wherein the field dielectric trench and the isolation trench are formed by joint oxidation processes.

17. The method according to claim 11, wherein forming the field dielectric layer further comprises forming a second insulating material different from the lateral isolation layer.

18. The method according to claim 17, wherein forming the field dielectric layer further comprises forming a third insulating material different from the second insulating material.

19. The method according to claim 11, wherein forming the lateral isolation layer comprises etching an upper portion of the lateral isolation layer, wherein at least a portion of the field dielectric layer is covered by a mask material during etching the upper portion of the lateral isolation layer.

20. A semiconductor device formed in a semiconductor substrate, comprising:
   an isolation trench in the semiconductor substrate to laterally insulate adjacent components of the semiconductor device, a lateral isolation layer being disposed in the isolation trench;
   a source region and a drain region;
   a body region and a drift region disposed between the source region and the drain region;
   a gate electrode adjacent to at least a portion of the body region; and
   a field plate adjacent to at least a portion of the drift region, a field dielectric layer being disposed between the drift region and the field plate, a top surface of the field dielectric layer being disposed at a greater height measured from a first main surface of the semiconductor substrate than a top surface of the lateral isolation layer,
   wherein a lower part of the field dielectric layer comprises a material of the lateral isolation layer and an upper part of the field dielectric layer comprises an insulating material different from the material of the lateral isolation layer.

* * * * *